(12) United States Patent
Chuang et al.

(10) Patent No.: US 11,106,854 B2
(45) Date of Patent: Aug. 31, 2021

(54) TRANSITION CELLS FOR ADVANCED TECHNOLOGY PROCESSES

(71) Applicant: TAIWAN SEMICONDUCTOR MANUFACTURING COMPANY LTD., Hsinchu (TW)

(72) Inventors: Yung-Hsu Chuang, Hsinchu (TW); Wen-Shen Chou, Zhubei (TW); Yung-Chow Peng, Hsinchu (TW); Yu-Tao Yang, Zhubei (TW); Yun-Ru Chen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 20 days.

(21) Appl. No.: 16/460,378

(22) Filed: Jul. 2, 2019

(65) Prior Publication Data

US 2020/0065452 A1 Feb. 27, 2020

Related U.S. Application Data

(60) Provisional application No. 62/720,523, filed on Aug. 21, 2018.

(51) Int. Cl.
*G06F 30/398* (2020.01)
*G03F 1/82* (2012.01)
*G03F 1/36* (2012.01)

(52) U.S. Cl.
CPC .............. *G06F 30/398* (2020.01); *G03F 1/36* (2013.01); *G03F 1/82* (2013.01)

(58) Field of Classification Search
CPC ...... G06F 30/347; G06F 30/39; G06F 30/392; G06F 30/398; G03F 1/36; G03F 1/82; H01L 21/82; H01L 27/0207
USPC .............................. 716/110, 119, 55
See application file for complete search history.

(56) References Cited

U.S. PATENT DOCUMENTS

| 7,260,442 | B2 | 8/2007 | Hwang et al. |
| 9,256,709 | B2 | 2/2016 | Yu et al. |
| 2010/0078725 | A1* | 4/2010 | Hou ................ H01L 27/0207 257/368 |
| 2013/0249014 | A1* | 9/2013 | Kito ...................... G06F 30/39 716/112 |
| 2014/0040838 | A1 | 2/2014 | Liu et al. |
| 2015/0179627 | A1* | 6/2015 | Huang ................ G06F 30/39 257/202 |
| 2015/0278429 | A1 | 10/2015 | Chang |

* cited by examiner

*Primary Examiner* — Paul Dinh
(74) *Attorney, Agent, or Firm* — Hauptman Ham, LLP

(57) ABSTRACT

A method including the operations of receiving a preliminary device layout including a plurality of active areas, analyzing the preliminary device layout to identify empty areas between the plurality of active areas, determining the configurations of the active areas bordering the empty areas, selecting a transition cell from a transition cell library in which the transition cell has a transitional configuration for reducing density gradient effects in the active areas adjacent the transition cell, and inserting the transition cells into the empty areas to define a modified device layout.

20 Claims, 9 Drawing Sheets

TRANSITION CELLS FOR ADVANCED TECHNOLOGY PROCESSES

CROSS REFERENCE TO RELATED APPLICATIONS

This application claims the benefit of U.S. Provisional Application No. 62/720,523, filed on Aug. 21, 2018, the entirety of which is incorporated by reference herein.

BACKGROUND

The semiconductor integrated circuit (IC) industry has continued to experience rapid growth with technological advances in IC materials and design producing successive generations of ICs, each new generation having smaller geometries and more complex circuits than the previous generation. The complexity of the associated layout, device structures, and manufacturing processes for producing each new generation of ICs has increased correspondingly in order to achieve the designed functional density.

The performance of advanced patterning and etching processes are affected by density gradient effects (DGE) associated with the particular IC device layout configuration being manufactured. Consideration and adjustment of the relative placement, height, and density of the functional and non-functional structures during IC device layout mitigate some of the DGE and improve the uniformity and performance of the resulting ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
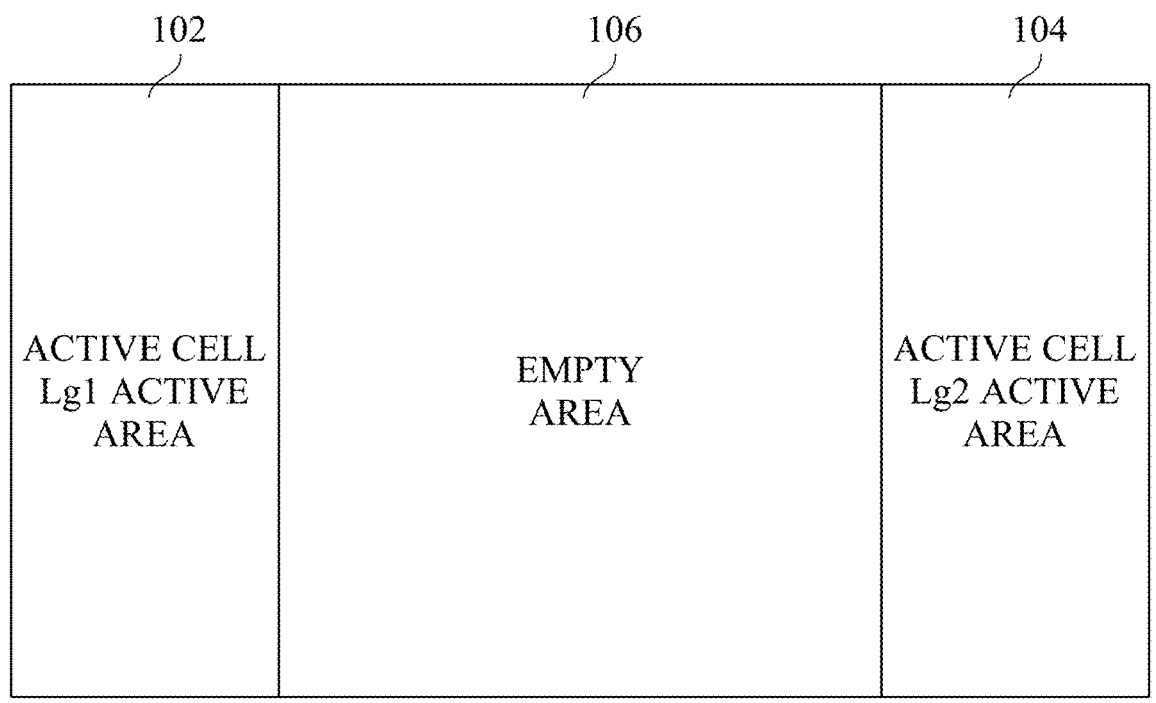
FIG. 1 is a top view of an initial integrated circuit layout including active areas separated by an empty area.

This description of the exemplary embodiments is intended to be read in connection with the accompanying drawings, which are to be considered part of the entire written description. The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Placing transition cells between active regions on IC design layouts in accordance with some embodiments will tend to reduce density gradient effects (DGE) and improve yield, process performance, and layout operations. In accordance with some embodiments, the transition cells are designed to incorporate and/or compensate for the various types of active regional abutment variations found between two adjacent active areas on IC layout designs. Incorporating specifically designed transition cells according to some embodiments provides an improved transition between adjacent active regions with regard to at least one of gate length, gate density, conductor density, threshold voltage (Vt), doping, gate length (Lg), and/or operating voltage.

FIG. 1 is a top view of a preliminary IC design layout 100 having a first active cell 102 (also referred to as an active array or active area) having a first gate configuration Lg1 corresponding to a first gate density and a second active cell 104 having a second gate configuration Lg2 corresponding to a second gate density. The first and second active cells 102, 104 are separated by an empty area 106 in which no functional elements are formed. Even if the first and second gate configurations Lg1, Lg2 are identical, the preliminary IC design layout 100 in FIG. 1 is likely to experience significant density gradient effects (DGE) during formation of the gate structures due to the imbalance between the gate densities of the active cells 102, 104 and the empty area 106.

Figure 2:
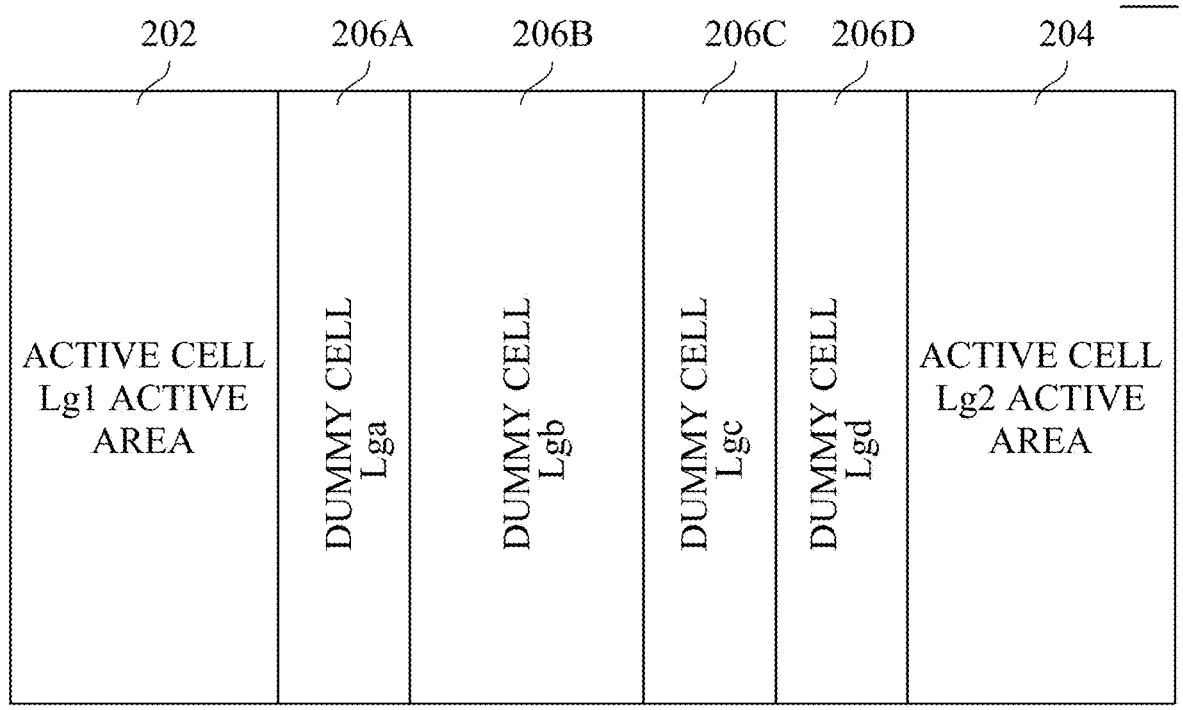
FIG. 2 is a top view of an integrated circuit layout including active areas in which an empty area has been filled with dummy cell regions.

FIG. 2 is a top view of a preliminary IC design layout 200 having a first active cell 202 having the first gate configuration Lg1 corresponding to a first gate density and a second active cell 204 having the second gate configuration Lg2 corresponding to a second gate density. Unlike the configuration in FIG. 1, however, in FIG. 2 the first and second active cells 202, 204 are separated by a plurality of dummy cells 206A, 206B, 206C, 206D, each of which in turn has a characteristic gate density Lga, Lgb, Lgc, Lgd. However, because the selection of the dummy cells is guided primarily by the size of the empty space between the first and second active cells 202, 204, there is no particular coordination between the gate densities of the dummy cells and the gate densities Lg1, Lg2 of the adjacent active cells. Accordingly, although dummy cells present an improvement over residual empty areas, density gradient effects (DGE) are still likely to be present during formation of the gate structures due to the imbalance between the gate densities of the active cells 202, 204 and the dummy cells 206A, 206B, 206C, 206D.

Figure 3:
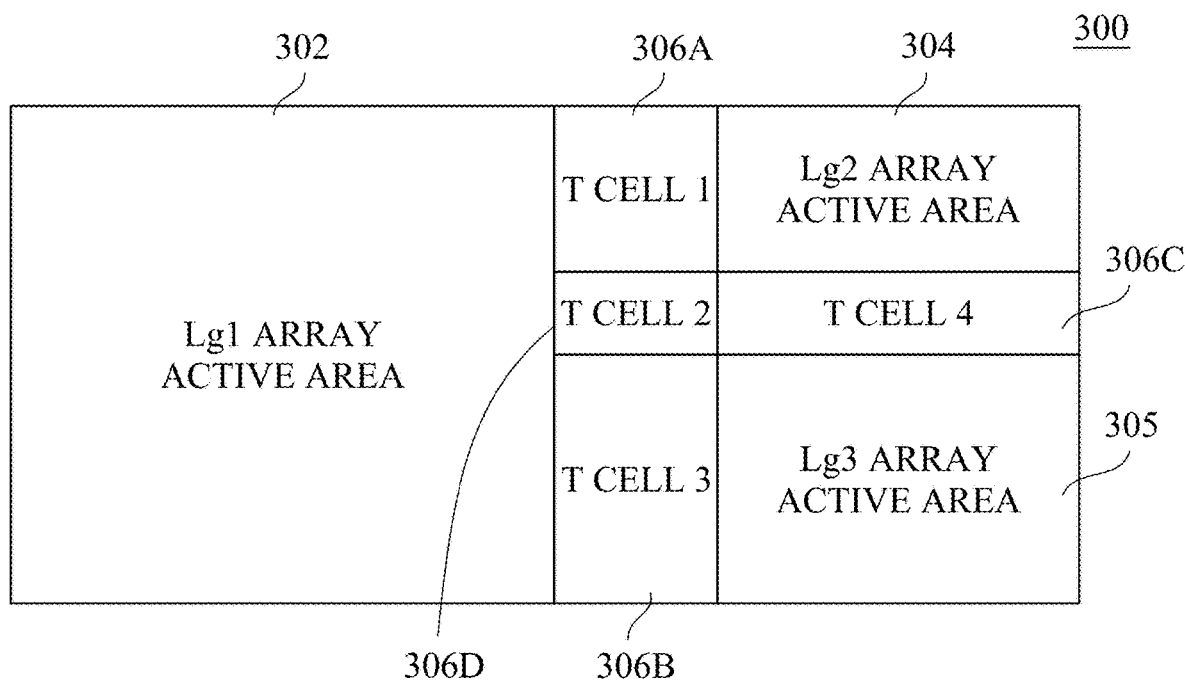
FIG. 3 is a top view of an integrated circuit layout including active areas in which empty areas between the active areas have been filled with transition cells in accordance with some embodiments.

FIG. 3 is a top view of an integrated circuit layout 300 including active areas in which empty areas between the active areas have been filled with transition cells in accordance with some embodiments. In some embodiments according to FIG. 3, a modified IC layout design 300 includes a plurality of active areas 302, 304, 305. Active area 302 is separated horizontally from active area 304 by transition cell 306A, active area 302 is also separated horizontally from active area 305 by transition cell 306B. Active area 304 is separated vertically from active area 305 by transition cell 306C. Transition cell 306D separates both transition cell 306A and transition cell 306B as well as active area 302 from transition cell 306C. The configuration of each of the transition cells 306A-D, is determined by the configuration of the proximate/adjacent active areas and/or transition cells and sized to fill the empty area. The transition cell configurations are a function of one or more of the structural/operational parameters of the proximate/adjacent active areas including, for example, gate length, gate density, gate height, doping, and/or operating voltage. The transition cell configurations are then selected to provide an extension of the active area configuration and/or an intermediate configuration in order to suppress density gradient effects (DGE) during subsequent semiconductor processing. In some embodiments, a first portion of the configuration of transition cell 306A includes gate length Lg1 from active area 302; and a second portion of the configuration of transition cell 306A includes gate length Lg2 from active area 304. In some embodiments, a first portion of the configuration of transition cell 306B includes gate length Lg1 from active area 302; and a second portion of the configuration of transition cell 306B includes gate length Lg3 from active area 305. In some embodiments, a first portion of the configuration of transition cell 306C includes gate length Lg3 from active area 305; and a second portion of the configuration of transition cell 306C includes gate length Lg2 from active area 304. In some embodiments, a first portion of the configuration of transition cell 306D includes gate length Lg1 or Lg2 from transition cell 306A; and a second portion of the configuration of transition cell 306D includes gate length Lg1 or Lg3 from transition cell 306B.

In some embodiments, transition cell 306A includes gate length $Lgi_A$ that is intermediate the gate length Lg1 from active area 302 and gate length Lg2 from active area 304. In some embodiments, transition cell 306B includes gate length $Lgi_B$ that is intermediate the gate length Lg1 from active area 302 and gate length Lg3 from active area 305. In some embodiments, transition cell 306D includes gate length $Lgi_D$ that is intermediate the gate length $Lgi_A$ from transition cell 306A and gate length $Lgi_B$ from transition cell 306B. In some embodiments, transition cell 306D includes gate length $Lgi_D$ that is intermediate the gate length Lg1 from active area 302 and gate length $Lgi_C$ from transition cell 306C. In some embodiments, transition cell 306C includes gate length $Lgi_C$ that is intermediate the gate length Lg3 from active area 305 and gate length Lg2 from active area 304. In some embodiments, the intermediate gate lengths $Lgi_A$, $Lg1_B$, $Lgi_C$, and $Lgi_D$, are the arithmetic mean of the gate lengths of the active areas and/or transition cells that are separated by the referenced transition cell. In some embodiments, the intermediate gate lengths $Lgi_A$, $Lgi_B$, $Lgi_C$, and $Lgi_D$, are the arithmetic mean of the gate lengths of the active areas that are separated by the transition cell that is then adjusted within a predetermined range, e.g., ±15%, whereby the intermediate gate length of the transition cell corresponds to an established target gate length compatible with the manufacturing process(es) used for manufacturing the resulting integrated circuit devices.

By using a configuration from adjacent active areas and/or adjacent transition cells in a transition cell, manufacturing processes are simplified and yield is improved over other approaches. Since the manufacturing parameters for forming the configuration of the active area are already known, extending those parameters to cover at least a portion of the transition cell avoids extra time used to determine manufacturing parameters for a configuration that is not present in any of the adjacent active areas or transition cells.

Figure 4:
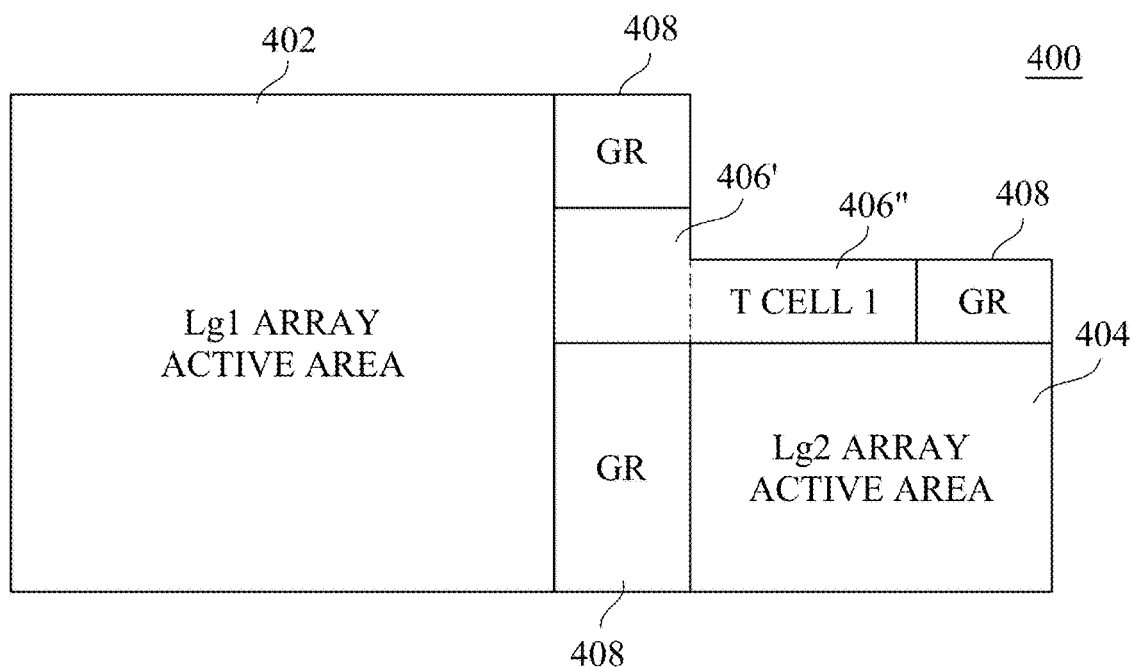
FIG. 4 is a top view of an integrated circuit layout including active areas in which the active areas are separated by a combination of guard rings (GR) and at least one transition cell(s) in accordance with some embodiments.

FIG. 4 is a top view of an integrated circuit layout 400 including active areas in which the active areas are separated by a combination of guard rings (GR) and at least one transition cell(s) in accordance with some embodiments. In some embodiments according to FIG. 4, a modified IC layout design 400 includes active areas 402, 404. In these embodiments, however, a plurality of guard rings (GR) 408 partially surrounds the active areas. The transition cell comprises both a first region 406' (adjacent active area 402) and a second region 406" (adjacent active area 404) with the two regions being sized to integrate with the peripheral guard rings 408. In some embodiments, the configuration of first region 406' matches the configuration of active area 402 and the configuration of second region 406" matches the configuration of active area 404.

Figure 5:
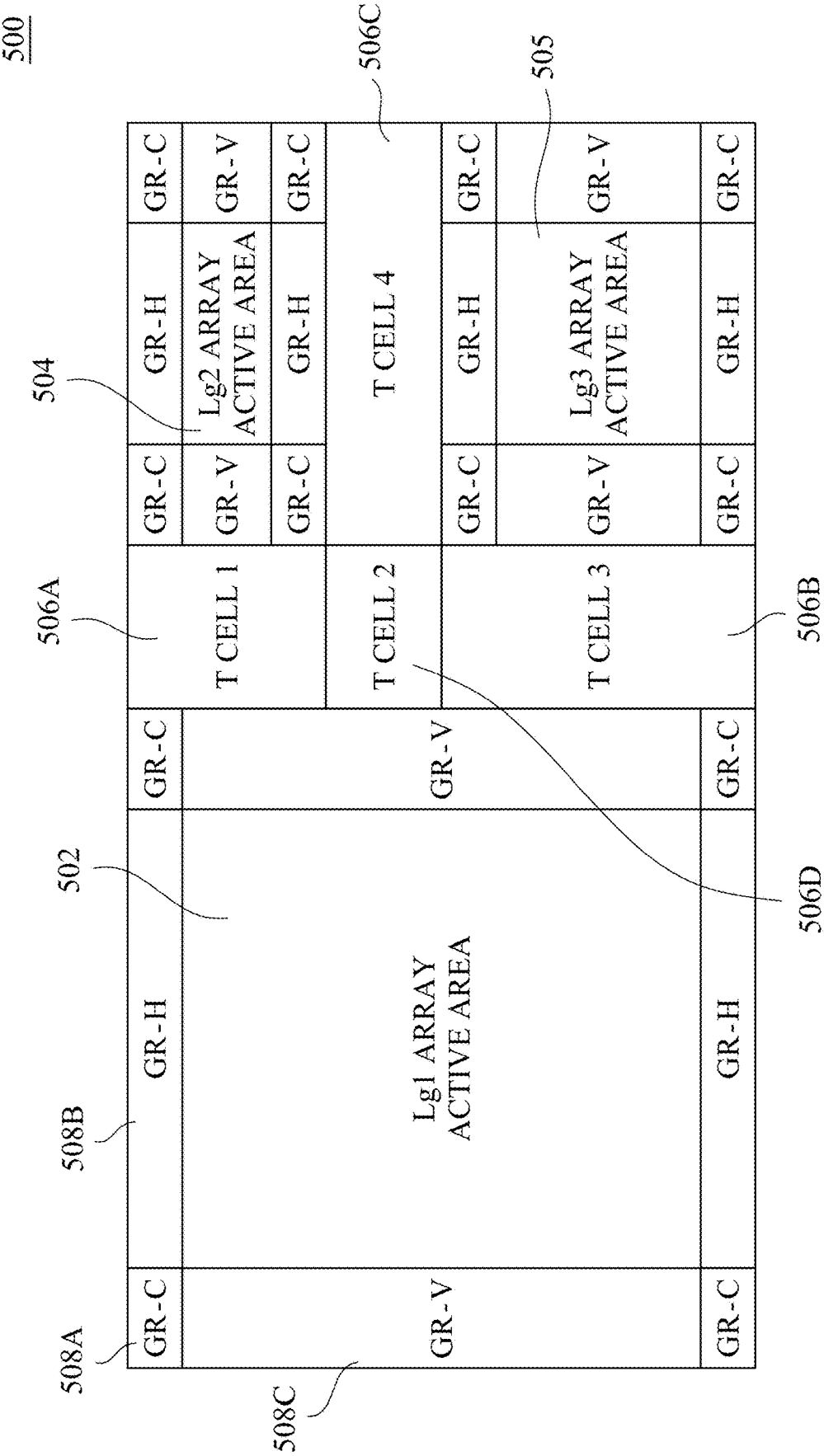
FIG. 5 is a top view of an integrated circuit layout including active areas in which the active areas are separated by a combination of guard rings (GR) and a plurality of transition cells (T CELL) in accordance with some embodiments.

FIG. 5 is a top view of an integrated circuit layout 500 including active areas in which the active areas are separated by a combination of guard rings (GR) and a plurality of transition cells (T CELL) in accordance with some embodiments. In some embodiments according to FIG. 5, modified IC layout design 500 incorporates guard rings surrounding each of the active areas 502, 504, 505. Depending on the position relative the adjacent active area, the guard rings include corner guard rings (GR-C) 508A, horizontal guard rings (GR-H) 508B, and vertical guard rings (GR-V) 508C. Although shown as unitary elements, one or more of the respective guard rings 508A, 508B, 508C, incorporate a plurality of separate structures, some of which may be identical, according to some embodiments. Further, although shown as distinct elements, two or more of the respective guard rings 508A. 508B, 508C, comprise substantially identical structures according to some embodiments. Active area 502 is separated horizontally from active area 504 by transition cell 506A, active area 502 is also separated horizontally from active area 505 by transition cell 506B. Active area 504 is separated vertically from active area 505 by transition cell 506C. Transition cell 506D separates both transition cell 506A and transition cell 506B as well as active area 502 from transition cell 506C.

Figure 6A:
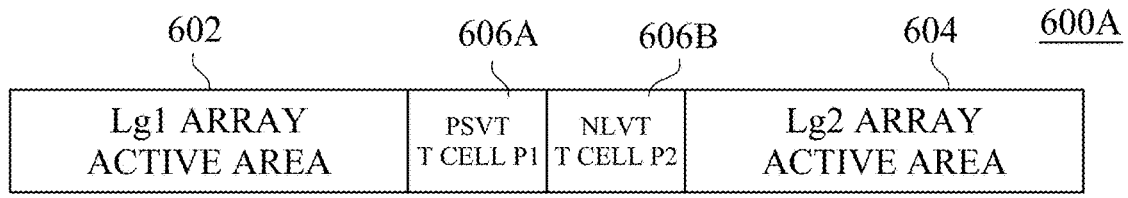
FIGS. 6A-6F are top views of integrated circuit layouts including active areas in which the active areas are separated by a hybrid transition cell in accordance with some embodiments.

FIG. 6A is a top view of an integrated circuit layout 600A including active areas in which the active areas are separated by a hybrid transition cell in accordance with some embodiments. In some embodiments according to FIG. 6A, modified IC layout design 600A includes a first active area 602, for example, a P-channel standard voltage array (PSVT), a second active area 604, for example, an N-channel low threshold voltage array (NLVT). The first and second active areas 602, 604 are separated by transition cell that includes first region 606A corresponding to the PSVT array and a second region 606B corresponding to NLVT array.

Figure 6B:
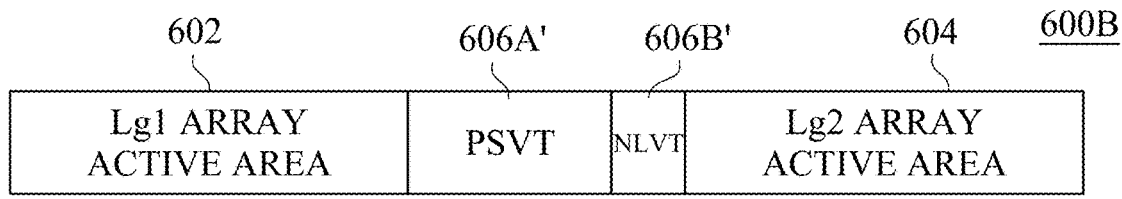

FIG. 6B is a top view of an integrated circuit layout 600B including active areas in which the active areas are separated by a hybrid transition cell in accordance with some embodiments. In some embodiments according to FIG. 6B, modified IC layout design 600B includes a first active area 602, for example, PSVT, a second active area 604, NLVT. The first and second active areas 602, 604 are separated by transition cell that includes first region 606A' corresponding to the PSVT array and a second region 606B' corresponding to NLVT array in which the sizing of first and second regions 606A', 606B' are adjusted to provide an additional buffer distance for the first active area 602. In some embodiments a ratio of the sizing of the first and second regions ranges between 7:3 and 3:7.

Figure 6C:
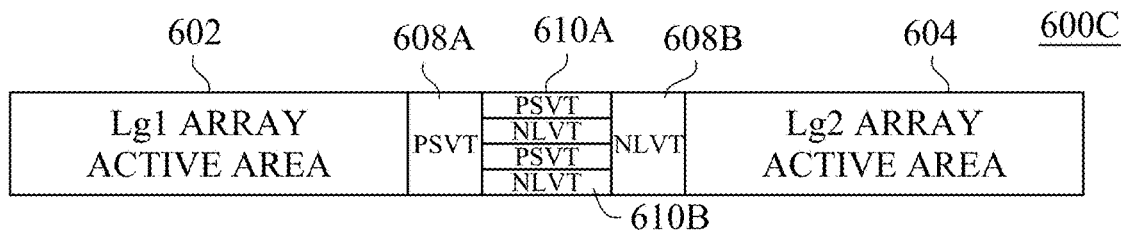

FIG. 6C is a top view of an integrated circuit layout 600C including active areas in which the active areas are separated by a hybrid transition cell in accordance with some embodiments. In some embodiments according to FIG. 6C, modified IC layout design 600C includes a first active area 602, for example, PSVT, a second active area 604, NLVT. The first and second active areas 602, 604 are separated by transition cell that includes first region 608A corresponding to the PSVT array, a second region 608B corresponding to NLVT array, and a third region incorporating alternating regions 610A, 610B, corresponding to the PSVT and NLVT arrays, to provide an average gate density value that is intermediate the gate density values for the first and second active regions 602, 604.

Figure 6D:
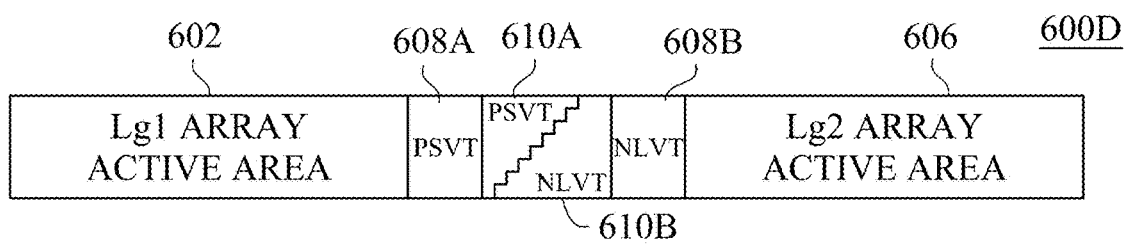

FIG. 6D is a top view of an integrated circuit layout 600D including active areas in which the active areas are separated by a hybrid transition cell in accordance with some embodiments. In some embodiments according to FIG. 6D, modified IC layout design 600D includes a first active area 602, for example, PSVT, a second active area 604, for example, NLVT. The first and second active areas 602, 604 are separated by transition cell that includes first region 608A corresponding to the PSVT array, a second region 608B corresponding to NLVT array, and a third region incorporating stepped regions 610A, 610B, corresponding to the PSVT and NLVT arrays, to provide an average gate density value gradient that is intermediate the gate density values for the first and second active regions 602, 604.

Figure 6E:
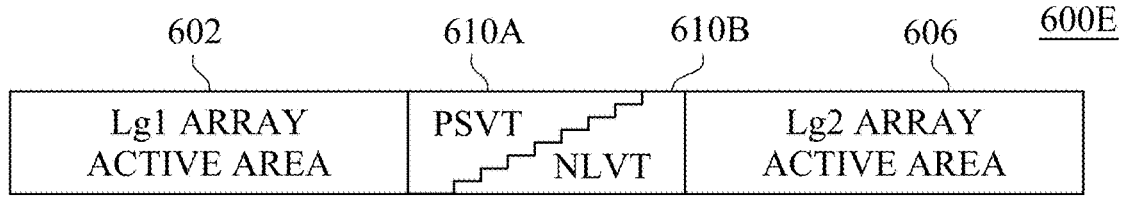

FIG. 6E is a top view of an integrated circuit layout 600E including active areas in which the active areas are separated by a hybrid transition cell in accordance with some embodiments. In some embodiments according to FIG. 6E, modified IC layout design 600E includes a first active area 602, for example, PSVT, a second active area 604, for example, NLVT. The first and second active areas 602, 604 are separated by transition cell that includes stepped regions 610A, 610B, corresponding to the PSVT and NLVT arrays respectively, to provide an average gate density value gradient that is intermediate the gate density values for the first and second active regions 602, 604.

Figure 6F:
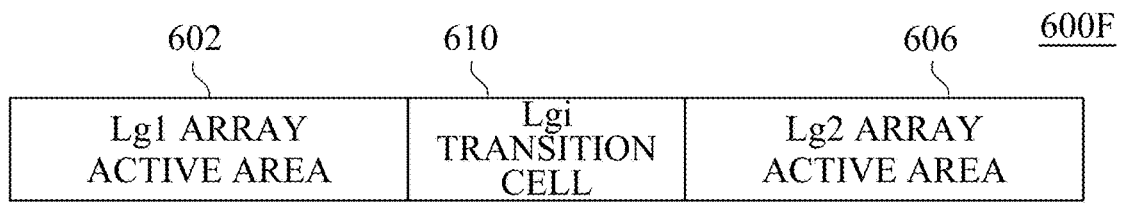

FIG. 6F is a top view of an integrated circuit layout 600F including active areas in which the active areas are separated by a hybrid transition cell in accordance with some embodiments. In some embodiments according to FIG. 6F, modified IC layout design 600F includes a first active area 602, for example, PSVT, a second active area 604, for example, NLVT. The first and second active areas 602, 604 are separated by transition cell 610 characterized by gate length Vgi that exhibits a uniform gate density value that is intermediate the gate density values for the first and second active regions 602, 604. In some embodiments the intermediate gate length Vgi is an average of the gate lengths of the active areas, i.e., Lg1 and Lg2. In some embodiments, the average of the gate lengths of the active areas is adjusted up or down as necessary in order (typically by 15% or less) to utilize an established gate length and thereby avoid a custom gate length and permit the use of existing design elements for formulating the transition cell.

Figure 7A:
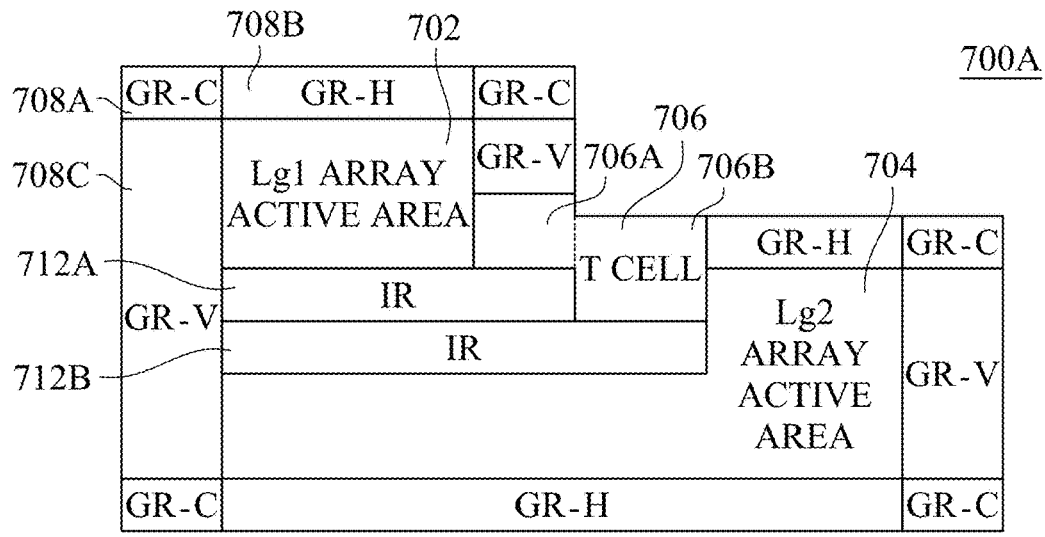
FIGS. 7A-7C are top views of integrated circuit layouts including active areas in which the active areas are separated by a combination of guard rings (GR), other structures (IR) and at least one transition cell in accordance with some embodiments.
Figure 7B:
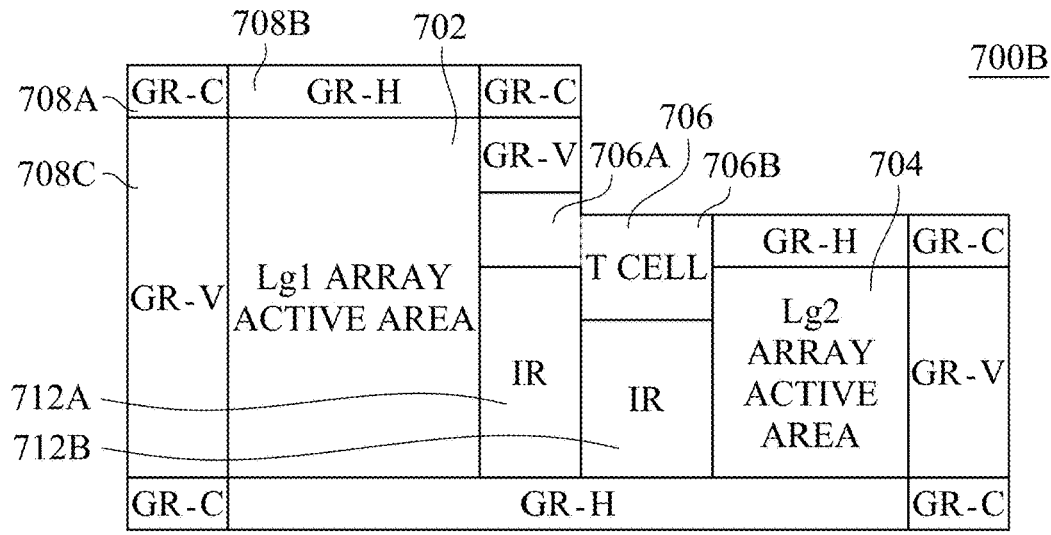
Figure 7C:
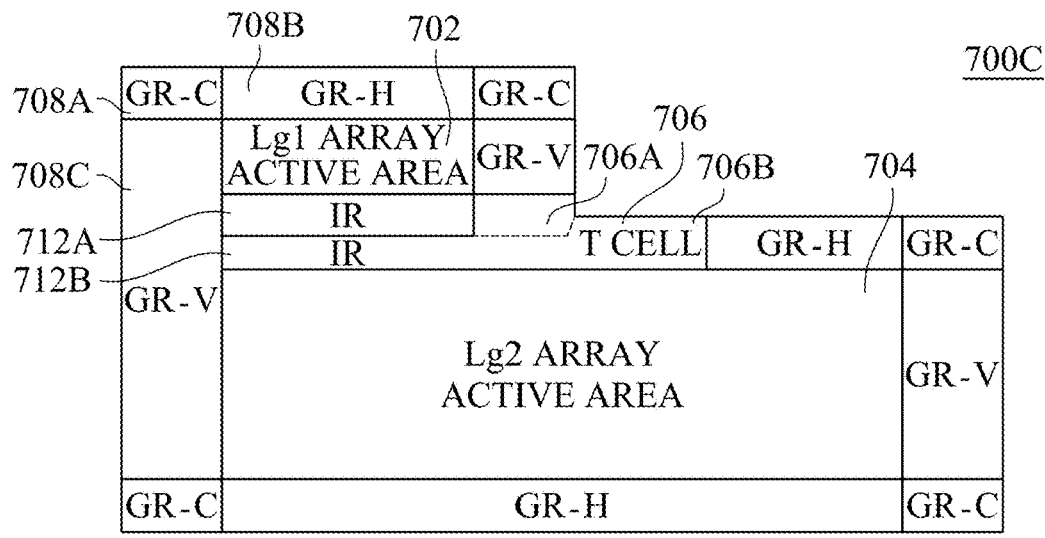

FIGS. 7A-7C are top views of integrated circuit layouts 700A-700C including active areas which are bounded by a combination of guard rings (GR), other structures (IR) present in the IC device layout and at least one transition cell in accordance with some embodiments. In some embodiments according to FIGS. 7A-7C, modified IC layout designs 700A-700C include a first active area 702, having, for example, a first gate length Lg1, a second active area 704, having, for example, a second gate length Lg2. In these embodiments, however, a plurality of guard rings is provided around the active areas. Depending on the position relative the adjacent active area, in some embodiments, the guard rings include corner guard rings (GR-C) 708A, horizontal guard rings (GR-H) 708B, and vertical guard rings (GR-V) 708C. In some embodiments, the various guard rings will utilize similar or substantially identical structures, while in other embodiments, the various guard rings will utilize position-specific structures. Although shown as unitary elements, one or more of the respective guard rings 708A. 708B, 708C incorporate a plurality of separate structures, some of which may be identical, according to some embodiments. Further, although shown as distinct elements, two or more of the respective guard rings 508A. 508B, 508C, comprise substantially identical structures according to some embodiments and/or be joined to provide a unitary guard ring structure. The modified IC layout designs 700A-700C also include non-gate structures 712A, 712B, arranged adjacent one or more of the active areas. The first and second active areas 702, 704 are also separated by transition cell 706 sized and configured to fill the empty space remaining after the automatic routing and placement of active areas has been completed. In some embodiments, transitional cell 706 includes first and second regions 706A, 706B, with the first region 706A generally corresponding to the first active area 702 and the second region 706B generally corresponding to the second active area 704, for balancing the structural, gate length, gate density, patterning, and/or topographic differences between the first and second active areas 702, 704.

Figure 8:
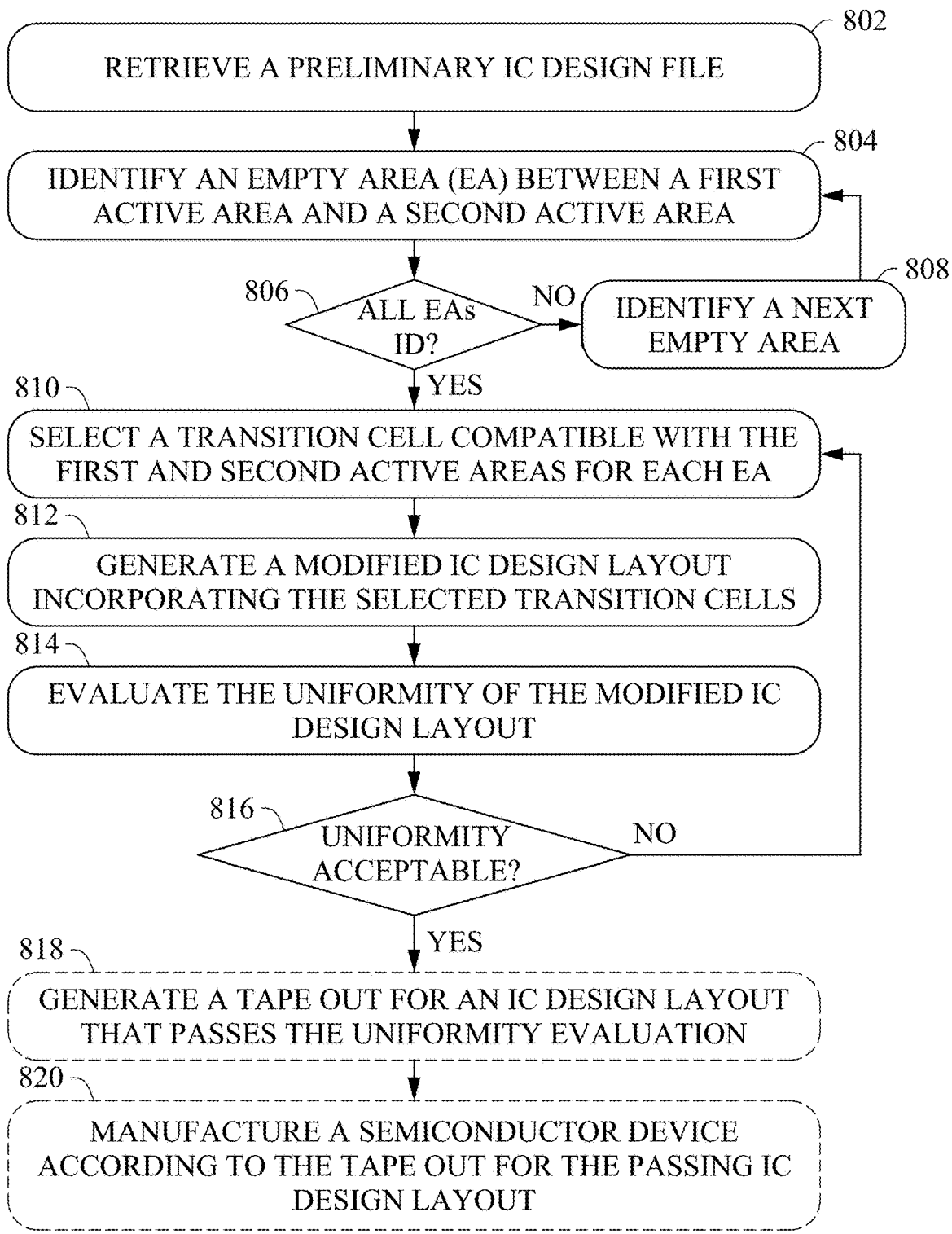
FIG. 8 is a flow diagram of a method for modifying an IC design layout to include transition cells in accordance with some embodiments.

FIG. 8 is a flowchart of a method 800 for improving the uniformity of the gate structures in connection with integrated circuit design by taking into account the degrading effects of the density gradient effect (DGE) resulting from mismatched gate densities in adjacent regions of the IC design layout, i.e., structures that have significantly higher or lower gate densities that are situated within an impact area (an area over which patterning, etching, and/or deposition effects are known or expected to occur) that is associated with one or more target structures.

Evaluating the relative gate densities of surrounding structures will, in some embodiments, allow for mitigation of the DGE using one or more transition cells. By recognizing and compensating for the DGE associated with mismatched gate densities, the IC design layout modification and associated improvement in gate density uniformity, according to some embodiments, will improve the uniformity of the anticipated structure of the resulting semiconductor device, thereby increasing the likelihood that the semiconductor devices will meet or exceed customer expectations.

In some embodiments of methods 800 according to FIG. 8, in operation 802, a preliminary IC design layout is retrieved for evaluation. In operation 804, the preliminary IC design file is evaluated to identify empty areas (EA) between active areas that are not otherwise occupied by, for example, guard ring (GR) structures or other non-gated structures (IR). Operation 806 involves a query regarding the extent to which the empty areas have been successfully identified. If fewer than all of the empty areas have been identified, method 800 branches from operation 806 to operation 808 in order to identify the next the empty area for evaluation. When all of the empty areas have been identified, method 800 branches to operation 810 for selecting a transition cell for each of the identified empty areas. The selection of an appropriate transition cell in operation 810 involves an evaluation of both the configuration of each of the active areas that define the empty area under analysis and the sizing/shape of the empty area to be filled with the selected transition cell.

Libraries of transition cells are made available for a designer's selection and/or modification for use in an IC layout design. Each of the transition cells available in a library has passed complex advanced technology rule checks (DRC) and will be useful in addressing at least one of the types of active area abutment differences in the IC layout design. Transition cells according to some embodiments provide a range of options for matching and/or approximating one or more parameters of the adjacent active areas, e.g., gate length, gate density, and/or operating voltage ($V_{DD}$) types for placement between various combinations of active areas. For example, in IC designs including decoupling capacitor (DCAP) regions, different doping, structures, Lg, gate density, and/or Vt, using transition cells according to some embodiments allows a designer to achieve better matching of poly/active area (OD) densities across an IC layout design. This improved configuration matching, in turn, reduces DGE within the active areas and improves the yields of the resulting devices manufactured from such a modified design.

Because embodiments of the transition cells incorporate specific design rules for known and/or anticipated types of abutment differences, DRC update revisions and node-to-node porting are simplified and able to be made efficiently across a family or a library of transition cell designs. In some embodiments, the library of transition cell designs will include transition cells suitable for positioning between core, input/output, and DCAP active areas as well as active areas utilizing different operating voltages. For example, some embodiments include IC layout designs incorporating a standard threshold voltage (SVT), a low threshold voltage (LVT), and/or an ultralow threshold voltage (ULVT). The configuration of the transition cells according to some embodiments would be modified whereby a transition cell is available for each of the types of operating voltage abutments between a first and second active area as reflected below in TABLE 1.

TABLE 1

| Second Active Area Operating Voltage | First Active Area Operating Voltage | | |
|---|---|---|---|
| | SVT | LVT | ULVT |
| SVT | SVT | SVT/LVT | SVT/ULVT |
| LVT | LVT/SVT | LVT | LVT/ULVT |
| ULVT | ULVT/SVT | ULVT/LVT | ULVT |

Turning to TABLE 1, for example, if a first active area is configured for low voltage operation (LVT) and an adjacent second active area is configured for ultralow voltage operation (ULVT), a transition cell interposed between the first and second active areas in some embodiments would have a combination of both LVT structures and ULVT structures, i.e., a LVT/ULVT configuration, with the transition cell arranged to place the LVT region adjacent the LVT first active area and the ULVT region adjacent the ULVT second active area.

Some embodiments comprise methods including the operations of receiving a preliminary device layout including a plurality of active areas; analyzing the preliminary device layout to identify adjacent first and second active areas that are separated by an empty area; determining the configuration of the first and second active areas and, when the first and second configurations are not identical, selecting a transition cell having a transitional configuration and sized to fill the empty area from a transition cell library. In those instances in which the configurations of the first and second active areas are identical, or substantially so, the transitional cells configuration will correspond to that of both the first and second active areas. These operations of identifying the active areas in selecting suitable transition cells will be continued until each of the empty areas has been filled with a suitable transition cell to produce a modified IC design layout. In some embodiments, the modified IC design layout will be used to generate a tape out that can, in turn, be used, to manufacture an IC device according to the modified IC design layout.

In some embodiments, the transition cell will include two distinct regions, a first region corresponding to the first active area and a second region corresponding to the second active area. In some embodiments, the relative sizing of the first and second regions is adjusted whereby one region comprises up to 70% of the area of the transition cell. In some embodiments, the transition cell will reflect a substantially uniform gate density across the entire width of the transition cell. In some embodiments the transition cell will reflect a gradient, or stepped gradient, thereby providing a gradual shift between the gate densities associated with the first and second active areas. In some embodiments, the transition cell will be characterized by a gate length that is the arithmetic mean of the gate lengths of the first and second active areas. In some embodiments the transition cell will be characterized by a gate length that is within about 15% of the arithmetic mean of the gate lengths of the first and second active areas but which corresponds to a gate length target for devices found in the cell library and/or transition cell library.

Operation 812 involves generating a modified IC design layout in which selected transition cells are incorporated into the preliminary IC design layout. In operation 814, the modified IC design layout is evaluated for overall gate density uniformity. Operation 816 involves a query regarding the extent to which the uniformity evaluation of operation 814 meets a predetermined uniformity target value. If the uniformity evaluation score is below the uniformity target value, method 800 branches back to operation 810 to improve the selection of the transition cell(s) which are reducing the uniformity evaluation score.

For those modified IC design layouts that pass the uniformity evaluation, method 800 includes an optional operation 818, in some embodiments, during which a tape out data file corresponding to the passing modified IC design layout is generated. For those modified IC design layouts for which a tape out data file is generated, the tape out data file will be used to manufacture a semiconductor device according to the passing modified IC design layout in optional operation 820.

In some embodiments, the modified device layout will be evaluated for gate density uniformity. In those instances in which a gate density uniformity target value is met, the modified IC design layout will be approved for tape out and, ultimately, the manufacture of the corresponding IC device. In some embodiments, in those instances in which the gate density uniformity target value is not met, the performance of the individual transition cells will be evaluated to identify the lowest performing transition cells. These low performing transition cells are modified or replaced in order to improve the overall gate density uniformity performance of the IC design layout.

In some embodiments, the transition cell includes two distinct transition regions including a first region corresponding to the first active area, a second region corresponding to the second active area, with the relative sizing of the first and second regions falling between the ratios of 7:3 and 3:7. In some embodiments, the transition cell includes three distinct transition regions including one region corresponding to the first active area, a second region corresponding to the second active area, and a third region corresponding to an intermediate value between the first and second active areas.

Figure 9:
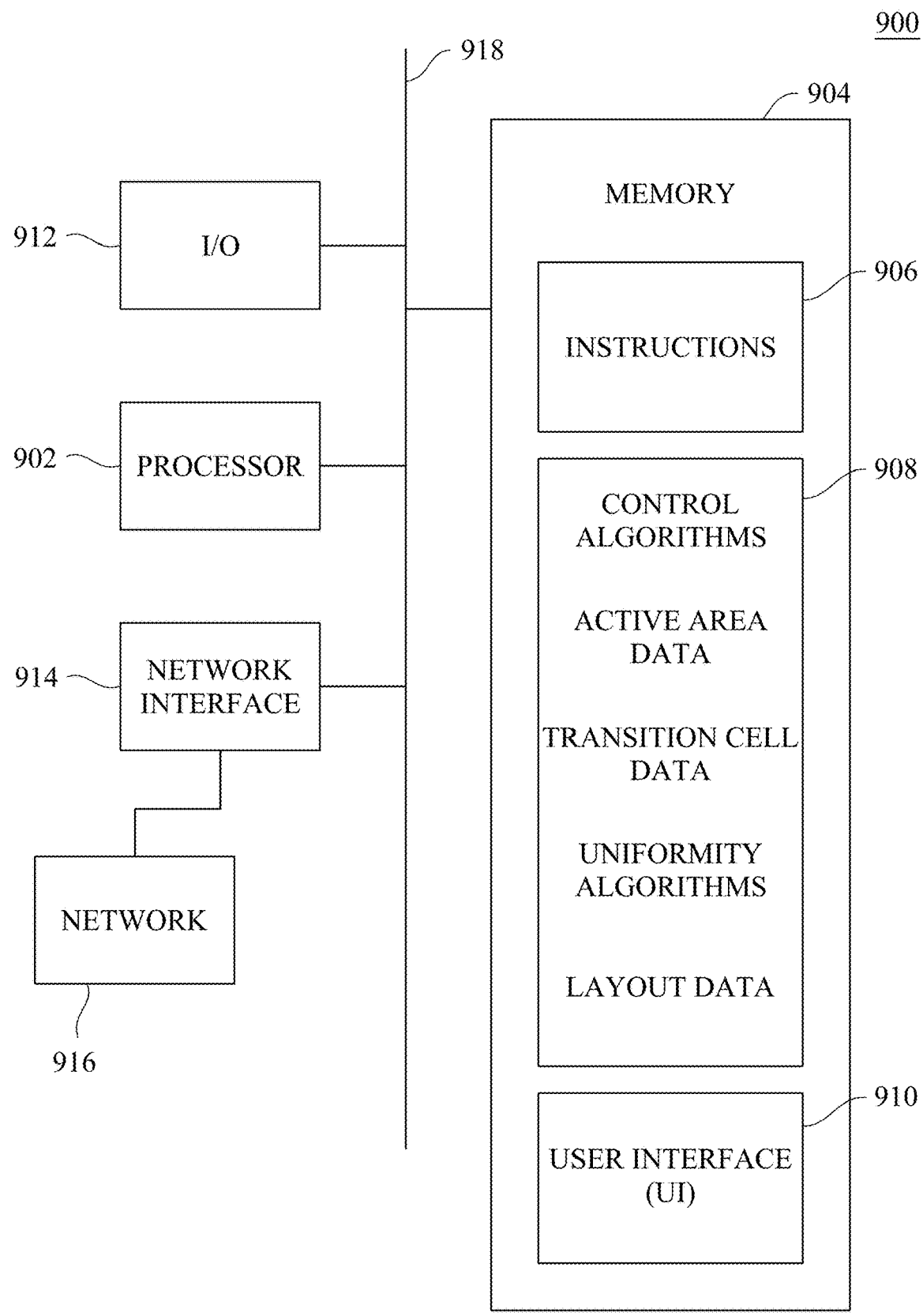
FIG. 9 is a schematic view of an electronic process control (EPC) system useful in the operation of an IC design layout modification in accordance with some embodiments.

FIG. 9 is a block diagram of an electronic process control (EPC) system 900, in accordance with some embodiments. Methods described herein of generating cell layout diagrams, in accordance with one or more embodiments, are implementable, for example, using EPC system 900, in accordance with some embodiments. In some embodiments, EPC system 900 is a general purpose computing device including a hardware processor 902 and a non-transitory, computer-readable storage medium 904. Storage medium 904, amongst other things, is encoded with, i.e., stores, computer program code (or instructions) 906, i.e., a set of executable instructions. Execution of computer program code 906 by hardware processor 902 represents (at least in part) an EPC tool which implements a portion or all of, e.g., the methods described herein in accordance with one or more (hereinafter, the noted processes and/or methods).

Hardware processor 902 is electrically coupled to computer-readable storage medium 904 via a bus 918. Hardware processor 902 is also electrically coupled to an I/O interface 912 by bus 918. A network interface 914 is also electrically connected to hardware processor 902 via bus 918. Network interface 914 is connected to a network 916, so that hardware processor 902 and computer-readable storage medium 904 are capable of connecting to external elements via network 916. Hardware processor 902 is configured to execute computer program code 906 encoded in computer-readable storage medium 904 in order to cause EPC system 900 to be usable for performing a portion or all of the noted processes and/or methods. In one or more embodiments, hardware processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause EPC system 900 (where such execution represents (at least in part) the EPC tool) to be usable for performing a portion or all of the noted processes and/or methods. In one or more embodiments, storage medium 904 also stores information which facilitates performing a portion or all of the noted processes and/or methods. In one or more embodiments, storage medium 904 stores process control data 908 including, in some embodiments, control algorithms, active area data, transition cell data, uniformity algorithms, layout data, and constants, target ranges, set points, and code for enabling statistical process control (SPC) and/or model predictive control (MPC) based control of the various processes.

EPC system 900 includes I/O interface 912. I/O interface 912 is coupled to external circuitry. In one or more embodiments, I/O interface 912 includes a keyboard, keypad, mouse, trackball, trackpad, touchscreen, and/or cursor direction keys for communicating information and commands to hardware processor 902.

EPC system 900 also includes network interface 914 coupled to hardware processor 902. Network interface 914 allows EPC system 900 to communicate with network 916, to which one or more other computer systems are connected. Network interface 914 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 900.

EPC system 900 is configured to receive information through I/O interface 912. The information received through I/O interface 912 includes one or more of instructions, data, design rules, process performance histories, target ranges, set points, and/or other parameters for processing by hardware processor 902. The information is transferred to hardware processor 902 via bus 918. EPC system 900 is configured to receive information related to a user interface (UI) through I/O interface 912. The information is stored in computer-readable medium 904 as user interface (UI) 910.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 900.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
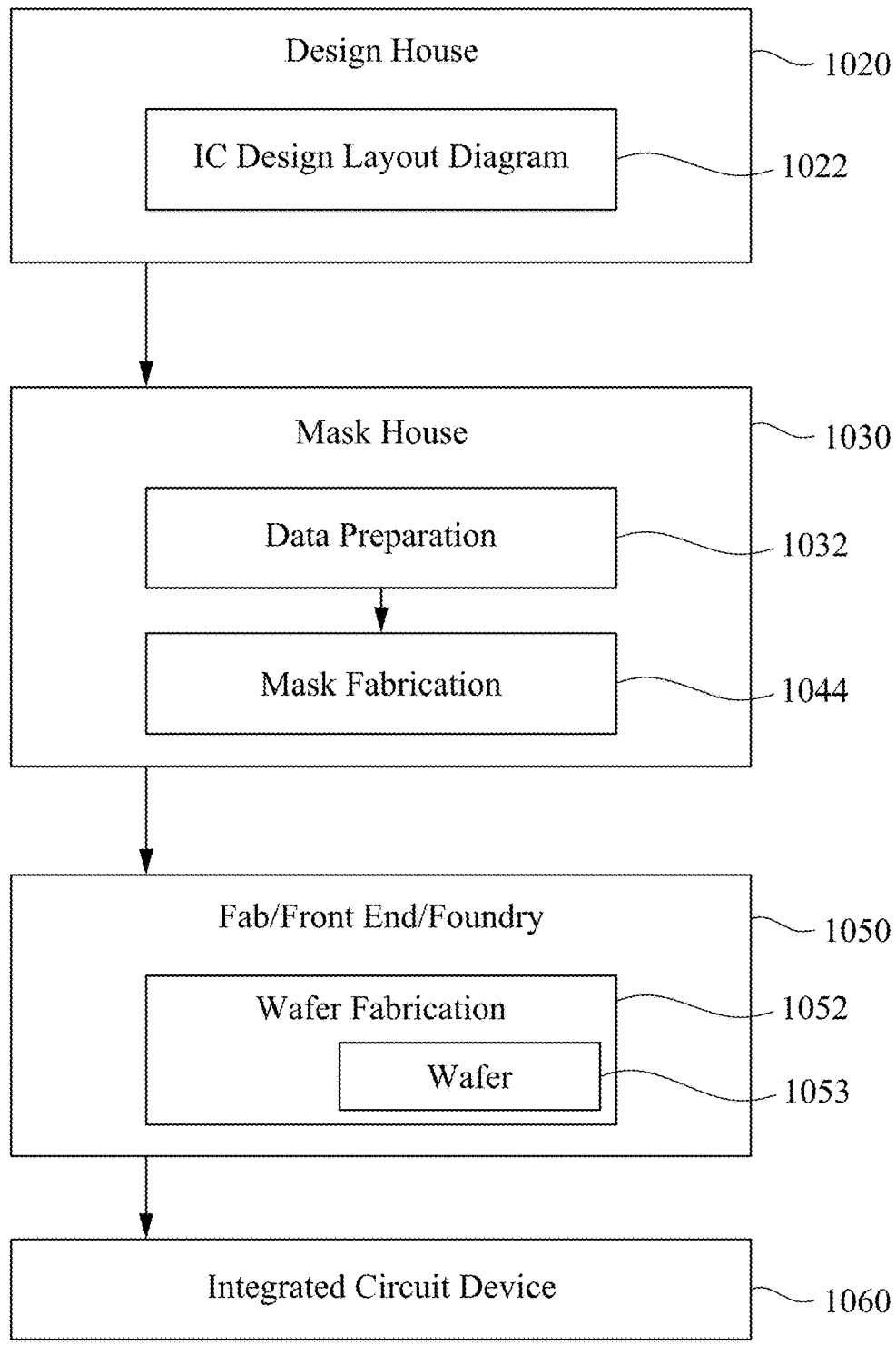
FIG. 10 is a flow diagram of a manufacturing process for an integrated circuit in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 is be expressed in a GDSII file format or DFII file format, according to some embodiments.

Whereas the pattern of a modified IC design layout diagram is adjusted by a method such as method 800, in order to reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 1030 includes mask data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 are collectively referred to as mask data preparation.

In some embodiments, mask data preparation 1032 includes optical proximity correction (OPC) which uses lithography enhancement techniques to compensate for image errors, such as those that arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which undoes part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. In some embodiments, the processing parameters in LPC simulation include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

One of ordinary skill in the art would understand that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during mask data preparation 1032 is executed in a variety of different orders, according to some embodiments.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. In some embodiments, mask 1045 is formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask is attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, according to some embodiments, a manufacturing facility for the front end fabrication of a plurality of IC products (front-end-of-line (FEOL) fabrication), while a second manufacturing facility is provided the back end fabrication for the interconnection and packaging of the IC products (back-end-of-line (BEOL) fabrication), and a third manufacturing facility is provided other services for the foundry business. In some embodiments of the present disclosure, fin dimensional adjustment includes operations associated with making an array of fins across an entirety of the fin-containing functional areas of the integrated circuit, followed by modification of fin dimensions in at least one fin-containing functional area of the integrated circuit. In some embodiments of the present disclosure, the fins of different fin-containing functional areas are formed to a final fin shape or fin dimensional profile separately, in a single fin-formation manufacturing flow for each fin-containing functional area of the IC. In some embodiments, the fin dimension adjustment occurs by forming fins in a layer of fin material, or fin substrate, by applying mask layer to a top surface of the fin material, patterning the mask layer with a pattern that corresponds to the locations of fins in one or more of the fin-containing functional areas, exposing a top surface of the fin material through the mask layer, and etching the fin material to form fins in the fin substrate. In some embodiments, the fins are formed in a single functional area of the IC with a final fin dimension, the selected fin dimension (or, fin height) as described above in operation 1050.

A patterned layer of mask material formed on a semiconductor substrate is made of a mask material that includes one or more layers of photoresist, polyimide, silicon oxide, silicon nitride (e.g., $Si_3N_4$), SiON, SiC, SiOC, or combinations thereof. In some embodiments, masks include a single layer of mask material. In some embodiments, a mask includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, fins of areas not covered by the mask, or fins in open areas of the pattern, are etched to modify a fin dimension. In some embodiments, the etching is performed on a top surface of fins with fin sides that are completely covered by adjoining dielectric support material deposited between fins in a previous manufacturing step. Etching of top surfaces of fins is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof. In some embodiments, etching the fins is performed by exposing an upper portion of fin material, extending above a top surface of a dielectric support medium deposited between fins and recessed below a top surface of the fin height in a prior manufacturing step, to a liquid chemical etch solution comprising one or more of the liquid chemical etchants described above. An upper portion of the fin material includes a top surface and sides of the fin material.

In some embodiments, the etching process is a dry-etch or plasma etch process. Plasma etching of a substrate material is performed using halogen-containing reactive gasses excited by an electromagnetic field to dissociate into ions. Reactive or etchant gases include $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed fin material by alternating electromagnetic fields or by fixed bias according to methods of plasma etching that are known in the art. In some embodiments, etching processes include presenting the exposed portions of fins of the functional area in an oxygen-containing atmosphere to oxidize an outer portion of the fin material, followed by a chemical trimming process such as plasma-etching or liquid chemical etching, as described above, to remove the oxidized semiconductor fin material and leave a modified fin behind. In some embodiments, fin oxidation followed by chemical trimming is performed to provide greater selectivity to the fin material and to reduce a likelihood of accidental fin material removal during a manufacturing process. In some embodiments, the exposed portions of fins of the functional area are top surfaces of the fins, the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Pub. No. 20150278429, published Oct. 1, 2015, U.S. Pre-Grant Pub. No. 20140040838, published Feb. 6, 2014, and U.S. Pat. No. 7,260,442, granted Aug. 21, 2007, each of which are hereby incorporated, in their entireties, by reference.

Figure 11A:
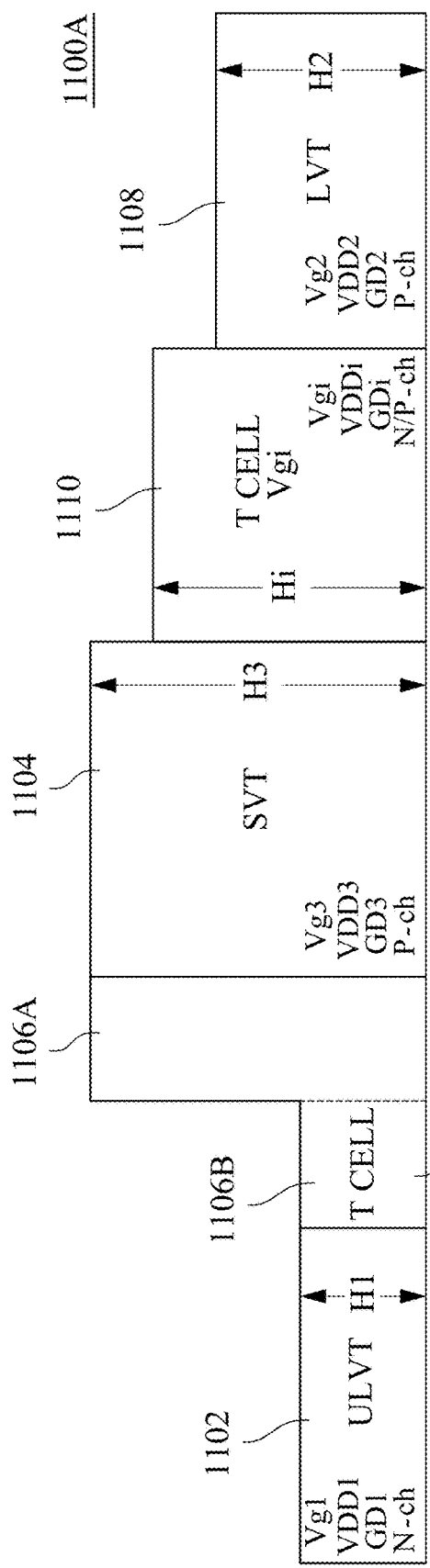
FIGS. 11A-11B are cross-sectional views of integrated circuit layouts including active areas in which the active areas are separated by a transition cell in accordance with some embodiments.

FIG. 11A is a cross-sectional view of an integrated circuit layout 1100A including active areas in which the active areas are separated by transition cells in accordance with some embodiments. A first active area 1102 is configured for ultralow voltage (ULVT) operation and is correspondingly characterized by a gate length Vg1, operating voltage VDD1, gate density GD1, channel doping, N-ch, and height H1. A second active area 1104 is configured for standard voltage (SVT) operation and is correspondingly characterized by a gate length Vg3, operating voltage VDD3, gate density GD3, channel doping, P-ch, and height H3. A third active area 1108 is configured for low voltage (LVT) operation and is correspondingly characterized by a gate length Vg2, and operating voltage VDD2, a gate density GD2, channel doping, P-ch, and a height H2.

The first 1102 and second 1104 active areas are, in turn, separated by transition cell 1106 that includes a first region 1106A, corresponding to the configuration of the second active area 1104, and a second region 1106B, corresponding to the configuration of the first active area 1102, thereby providing a non-operative transition region between the first and second active areas for the purpose of reducing density gradient effects in both the first and second active areas.

The second 1104 and third 1108 active areas are, in turn, separated by transition cell 1110 that includes a single region that does not precisely correspond to the configuration of either the second active area 1104 or the third active area 1108, but instead is configured to exhibit intermediate values, e.g., an average of the corresponding parameters of the second and third active areas including, for example, gate length Vgi, operating voltage VDDi, gate density GDi, channel doping, and a height Hi, thereby providing a non-operative transition region between the second and third active areas for the purpose of reducing density gradient effects in both the second and third active areas during subsequent semiconductor processing. In some embodiments, the intermediate values for transition cell 1110 are defined using a structure similar to 610A and 610B detailed in FIGS. 6C-6E; or using a structure similar to 610 detailed in FIG. 6F.

Figure 11B:
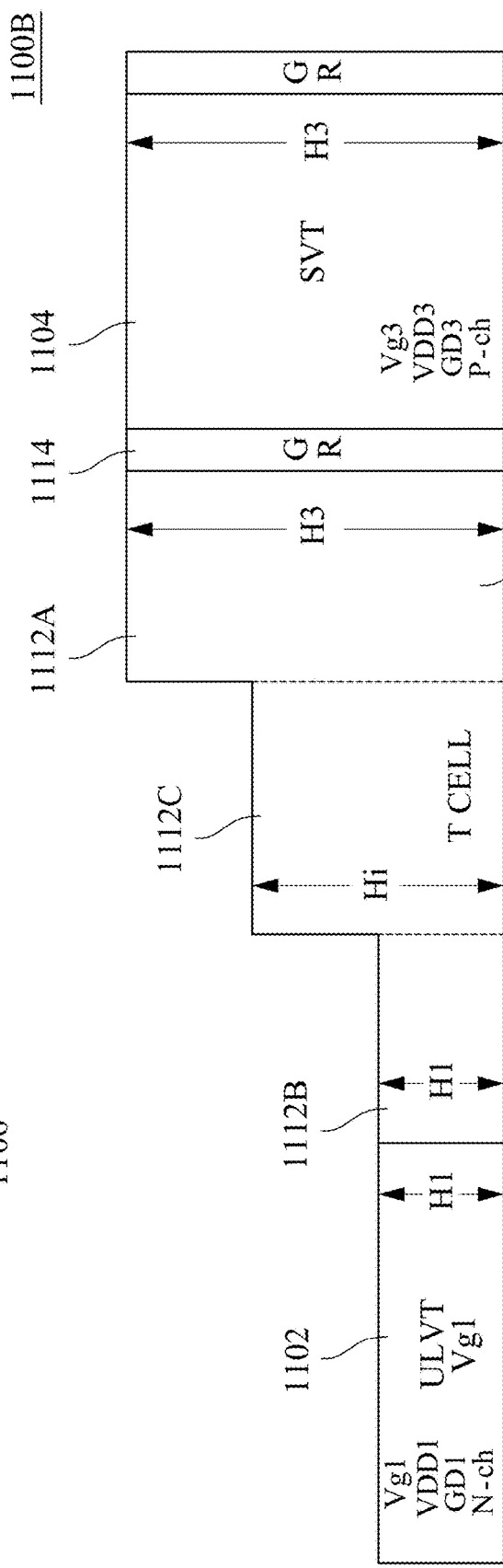

FIG. 11B is a cross-sectional view of an integrated circuit layout 1100B including active areas in which the active areas are separated by transition cells in accordance with some embodiments. A first active area 1102 is configured for ultralow voltage (ULVT) operation and is correspondingly characterized by a gate length Vg1, operating voltage VDD1, gate density GD1, channel doping, N-ch, and a height H1. A second active area 1104 is configured for standard voltage (SVT) operation and is correspondingly characterized by a gate length Vg3, and operating voltage VDD3, a gate density GD3, channel doping, P-ch, and a height H3. Second active area is also surrounded by guard rings 1114.

The first 1102 and second 1104 active areas are, in turn, separated by transition cell 1112 that includes a first region 1112A, corresponding to the configuration of the second active area 1104, and a second region 1112B, corresponding to the configuration of the first active area 1102, and a third region 1112C configured to exhibit intermediate values, e.g., an average of the corresponding parameters of the first and second active areas including, for example, gate length Vgi, operating voltage VDDi, gate density GDi, channel doping, and a height Hi, thereby providing a non-operative transition region between the first and second active areas for the purpose of reducing density gradient effects in both the first and second active areas. In some embodiments, the intermediate values for third region 1112C are defined using a structure similar to 610A and 610B detailed in FIGS. 6C-6E; or using a structure similar to 610 detailed in FIG. 6F.

Some embodiments comprise methods including the operations of receiving a preliminary device layout including a plurality of active areas; analyzing the preliminary device layout to identify adjacent first and second active areas that are separated by an empty area; determining the configuration of the first and second active areas and, when the first and second configurations are not identical, selecting a transition cell having a transitional configuration and sized to fill the empty area from a transition cell library. In those instances in which the configurations of the first and second active areas are identical, or substantially so, the transitional cells configuration will correspond to that of both the first and second active areas. These operations of identifying the active areas and selecting suitable transition cells will be continued until each of the empty areas has been filled with a suitable transition cell to produce a modified IC design layout. In some embodiments, the modified IC design layout will be used to generate a tape out that can, in turn, be used, to manufacture an IC device according to the modified IC design layout.

In some embodiments, the transition cell will include two distinct regions, a first region corresponding to the first active area and a second region corresponding to the second active area. In some embodiments, the relative sizing of the first and second regions is adjusted whereby one region comprises up to 70% of the area of the transition cell. In some embodiments, the transition cell will reflect a substantially uniform gate density across the entire width of the transition cell. In some embodiments the transition cell will reflect a gradient, or stepped gradient, thereby providing a gradual shift between the gate densities associated with the first and second active areas. In some embodiments, the transition cell will be characterized by a gate length that is the arithmetic mean of the gate lengths of the first and second active areas. In some embodiments the transition cell will be characterized by a gate length that is within about 15% of the arithmetic mean of the gate lengths of the first and second active areas but which corresponds to a gate length target for devices found in the cell library and/or transition cell library.

In some embodiments, the modified device layout will be evaluated for gate density uniformity. In those instances in which a gate density uniformity target value is met, the modified IC design layout will be approved for tape out and, ultimately, the manufacture of the corresponding IC device. In some embodiments, in those instances in which the gate density uniformity target value is not met, the performance of the individual transition cells will be evaluated to identify the lowest performing transition cells. These low performing transition cells will then be modified or replaced in order to improve the overall gate density uniformity performance of the IC design layout.

Some embodiments comprise a semiconductor device having a first active region having a first active configuration; second active region having a second active configuration, and a transition cell separating the first and second active regions, wherein the transition cell has a transitional configuration intermediate the first and second active configurations.

In some embodiments, the transition cell includes two distinct transition regions including one region corresponding to the first active area, a second region corresponding to the second active area, with the relative sizing of the first and second regions falling between the ratios of 7:3 and 3:7. In some embodiments, the transition cell includes three distinct transition regions including a first region corresponding to the first active area, a second region corresponding to the second active area, and a third region corresponding to an intermediate value between the first and second active areas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

We claim:

1. A computer-implemented method comprising:
receiving a preliminary device layout including a plurality of active areas;
analyzing the preliminary device layout to identify an empty area between a first active area and a second active area;
determining a first configuration of the first active area;
determining a second configuration of the second active area;
selecting a transition cell from a transition cell library, wherein the transition cell has a transitional configuration compatible with both the first configuration and the second configuration; and
inserting the transition cell into the empty area to define a modified device layout.

2. The method according to claim 1, wherein the transition cell selected from the transition cell library has the transitional configuration comprising:
a first transition region corresponding to the first configuration, the first transition region being adjacent the first active area, and
a second transition region corresponding to the second configuration, the second transition region being adjacent the second active area.

3. The method according to claim 2, wherein the first transition region comprises between 30% and 70% of an area of the transition cell.

4. The method according to claim 1, wherein the transition cell selected from the transition cell library has the transitional configuration comprising a substantially uniform gate density.

5. The method according to claim 1, wherein the transition cell selected from the transition cell library has the transitional configuration comprising a stepped gate density gradient.

6. The method according to claim 1, further comprising:
calculating a gate density uniformity for the modified device layout;
determining whether the calculated gate density uniformity satisfies a predetermined gate density uniformity target value; and
generating a tape out file for manufacture of a semiconductor device according to the modified device layout in response to the calculated gate density uniformity satisfying the density uniformity target value.

7. The method according to claim 1, further comprising:
calculating a gate density uniformity for the modified device layout;
determining whether the calculated gate density uniformity satisfies a predetermined gate density uniformity target value;
identifying a target transition cell of the modified device layout in response to the calculated gate density uniformity failing to satisfy the density uniformity target value; and
replacing the target transition cell with an alternative transition cell from the transition cell library, wherein replacing the target transition cell increases the gate density uniformity for the modified device layout.

8. The method according to claim 1, further comprising:
calculating a gate density uniformity for the modified device layout;
determining whether the calculated gate density uniformity satisfies a predetermined gate density uniformity target value;
identifying a target transition cell of the modified device layout in response to the calculated gate density uniformity failing to satisfy the density uniformity target value; and
modifying the target transition cell to increase the gate density uniformity.

9. The method according to claim 1, wherein:
determining the first configuration comprises determining a gate length $Lg1$ of the first active area;

determining the second configuration comprises determining a gate length Lg2 of the second active area; and selecting the transitional cell comprises selecting the transitional cell having an intermediate gate length Lgi, with Lgi being the average of Lg1 and Lg2.

10. The method according to claim 9, wherein selecting the transitional cell comprises selecting the transitional cell having the intermediate gate length Lgi adjusted by up to ±15% to correspond to a target gate length of a functional cell from a cell library.

11. A computer-implemented method comprising:

receiving a device layout including a plurality of active areas;

identifying empty areas between a first active area and a second active area by analyzing the device layout;

determining a first configuration of the first active area and a second configuration of the second active area;

selecting a transitional cell from a transitional cell library, wherein the selected transitional cell has a transitional configuration compatible with both the first configuration and the second configuration;

inserting the transitional cell into the empty area to define a modified device layout; and repeating the determining, selecting, and inserting operations until each of the empty areas identified in the device layout has been replaced by a transitional cell to define a final modified device layout.

12. The method according to claim 11, wherein selecting and inserting the transitional cell produces the modified device layout in which the transitional cell has the transitional configuration wherein a first transitional region is adjacent the first active area, and a second transitional region is adjacent the second active area.

13. The method according to claim 12, wherein selecting the transitional cell further comprises limiting the selection to transitional cells having the first transitional region comprising between 30% and 70% of a total area of the transitional cell.

14. The method according to claim 11, wherein selecting the transitional cells further comprises selecting the transitional cells from a first set of the transitional cells having the transitional configuration comprising a substantially uniform gate density.

15. The method according to claim 14, wherein selecting the transitional cells further comprises selecting the transitional cells from a second set of the transitional cells having the transitional configuration comprising a stepped gate density gradient.

16. The method according to claim 11, further comprising:

calculating a gate density uniformity for the final modified device layout;

determining whether the calculated gate density uniformity satisfies a predetermined gate density uniformity target value; and generating a tape out file for manufacture of a semiconductor device according to the final modified device layout in response to the calculated gate density uniformity satisfying the density uniformity target value.

17. The method according to claim 11, further comprising:

calculating a gate density uniformity for each modified device layout;

determining whether the calculated gate density uniformity shows improvement over a preceding modified device layout;

replacing the transitional cell with an alternative transitional cell from the transitional cell library when the calculated gate density uniformity fails to show improvement;

recalculating a gate density uniformity for the modified device layout including the alternative transitional cell; and repeating the replacing and recalculating operations until the calculated gate density uniformity of the modified device layout shows improvement before advancing to the next empty area.

18. A computer-implemented method comprising:

receiving a device layout;

identifying empty areas between a first active area and a second active area by analyzing the device layout;

determining a first configuration of the first active area and a second configuration of the second active area;

selecting a first subset of transitional cells from a transitional cell library, wherein each of the first subset of target transition cell has a transitional configuration compatible with both the first configuration and the second configuration;

calculating a gate density uniformity for each of a set of revised device layouts incorporating one of the first subset of transitional cells; and inserting the one of the first subset of transitional cells that produces a highest degree of gate density uniformity the revised device layout to produce a modified device layout.

19. The method according to claim 18, further comprising:

repeating the selecting, calculating, and inserting operations until each of the empty areas identified in the preliminary device layout has been replaced by a transitional cell to define a final modified device layout.

20. The method according to claim 19, further comprising:

calculating a gate density uniformity for the final modified device layout; and determining whether the calculated gate density uniformity satisfies a predetermined gate density uniformity target value.

* * * * *